(12) United States Patent
Lu et al.

(10) Patent No.: US 7,102,865 B2
(45) Date of Patent: Sep. 5, 2006

(54) OUTPUT DRIVER HAVING ELECTROSTATIC DISCHARGE PROTECTION

(75) Inventors: Albert Lu, Austin, TX (US); Steven G. Young, Austin, TX (US)

(73) Assignee: Silicon Laboratories, Austin, TX (US)

( * ) Notice: Subject to any disclaimer, the term of this patent is extended or adjusted under 35 U.S.C. 154(b) by 79 days.

(21) Appl. No.: 11/027,414

(22) Filed: Dec. 30, 2004

(65) Prior Publication Data

US 2006/0146457 A1 Jul. 6, 2006

(51) Int. Cl.
*H02H 3/00* (2006.01)
(52) U.S. Cl. .................................................. 361/56
(58) Field of Classification Search ............... 361/56
See application file for complete search history.

(56) References Cited

U.S. PATENT DOCUMENTS 6,249,410 B1 * 6/2001 Ker et al. ...................... 361/56
6,437,611 B1 * 8/2002 Hsiao et al. ................. 327/108
2006/0043490 A1 * 3/2006 Brauchler et al. .......... 257/355

* cited by examiner

*Primary Examiner*—Ronald Leja
(74) *Attorney, Agent, or Firm*—Antony P. Ng; Dillon & Yudell LLP

(57) ABSTRACT

An output driver having electrostatic discharge (ESD) protection is disclosed. The output driver includes a first gain transistor, a second gain transistor, a capacitor and a resistor. The first gain transistor provides a first stage gain, and the second gain transistor provides a second stage gain. The capacitor, which is connected to the first and second gain transistors, provides a compensation function between the first and second gain transistors during normal operations. In response to an occurrence of an ESD event at the output of the output driver, the capacitor turns on the second gain transistor The resistor, which is also connected to the first and second gain transistors, returns the second gain transistor to normal operations after the occurrence of an ESD event.

7 Claims, 2 Drawing Sheets

OUTPUT DRIVER HAVING ELECTROSTATIC DISCHARGE PROTECTION

BACKGROUND OF THE INVENTION

1. Technical Field

The present invention relates to output drivers in general, and, in particular, to an output driver having electrostatic discharge protection.

2. Description of Related Art

An electrostatic discharge (ESD) event is defined as a transfer of charges between bodies of different electrostatic potentials in proximity or via direct contact. ESD poses a reliability concern for integrated circuit devices. Different ESD models, such as human body model (HBM), machine model (MM) and charged device model (CDM), have been used for testing integrated circuit devices to make sure they are adequately protected against an ESD event. The difference among various ESD models mainly lies upon the amount of current delivered to an integrated circuit device to emulate an ESD event encountered by the integrated circuit device.

From a circuit design standpoint, ESD clamps are typically utilized to protect an integrated circuit device against an ESD event. An ESD clamp is effectively a large switch that is normally turned off except in the presence of an ESD event. During an ESD event, the switch is turned on to produce a conductive path for charges to be drained into a grounded network within the integrated circuit device.

Output drivers of an integrated circuit device are generally susceptible to ESD events because they are commonly connected to external pins that can be contacted by either human beings or machines. Thus, an ESD clamp is typically employed within an output driver to provide ESD protection. On the one hand, it is imperative to have an ESD clamp that is large enough to provide the maximum ESD protection. But on the other hand, the ESD clamp cannot be too large because it is costly and may affect the performance of the output driver.

The present disclosure targets the problem of placing an ESD clamp in an output driver such that the output driver meets the performance requirements as specified by technology developers while without compromising ESD protection.

SUMMARY OF THE INVENTION

In accordance with a preferred embodiment of the present invention, an output driver includes a first gain transistor, a second gain transistor, a capacitor and a resistor. The first gain transistor provides a first stage gain, and the second gain transistor provides a second stage gain. The capacitor, which is connected to the first and second gain transistors, provides a compensation function between the first and second gain transistors during normal operations. In response to an occurrence of an electrostatic discharge (ESD) event at the output of the output driver, the capacitor turns on the second gain transistor to drain the electrostatic charges to ground. The resistor, which is also connected to the first and second gain transistors, returns the second gain transistor to normal operations after the occurrence of the ESD event.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
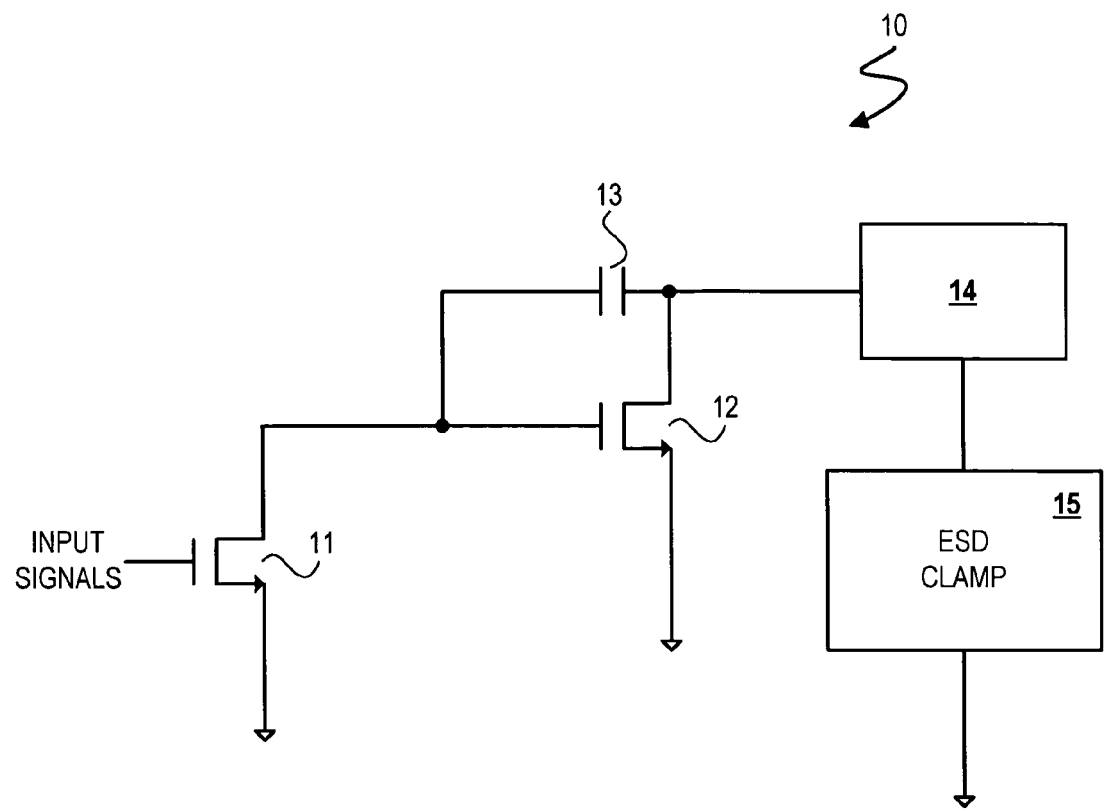
FIG. 1 is a schematic diagram of an output driver circuit, according to the prior art.

Referring now to the drawings and in particular to FIG. 1, there is depicted a schematic diagram of an output driver circuit, according to the prior art. As shown, an output driver circuit 10 includes a gain transistor 11 and a gain transistor 12. The drain of gain transistor 11 is connected to the gate of gain transistor 12. In addition, a Miller compensation capacitor 13 is connected between the drain of gain transistor 11 and the drain of gain transistor 12.

Output driver circuit 10 is a two-stage amplifier. Gain transistor 11 provides a first stage gain, and gain transistor 12 provides a second stage gain. Output driver circuit 10 receives input signals at the gate of gain transistor 11 and yields output signals at a pad 14 that is connected to the drain of gain transistor 12.

With the configuration shown in FIG. 1, output driver circuit 10 is very susceptible to electrostatic discharge (ESD) events at the output (i.e., pad 14). Thus, an ESD clamp 15 is typically added between pad 14 and ground to protect output driver circuit 10 from ESD events. Although ESD clamp 15 generally works well to provide the necessarily ESD protection, the size of ESD clamp 15 is usually very large and much silicon area needs to be consumed.

Figure 2:
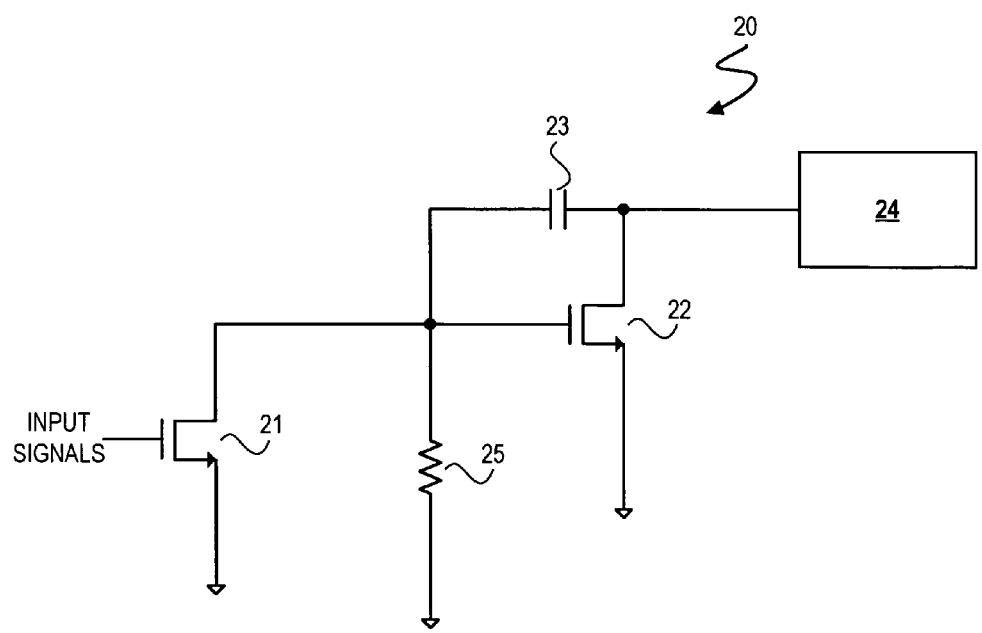
FIG. 2 is a schematic diagram of an output driver circuit, in accordance with a preferred embodiment of the present invention.

With reference now to FIG. 2, there is depicted a schematic diagram of an output driver circuit, in accordance with a preferred embodiment of the present invention. As shown, an output driver circuit 20 includes a gain transistor 21 and a gain transistor 22. The drain of gain transistor 21 is connected to the gate of gain transistor 22. In addition, a Miller compensation capacitor 23 is connected between the drain of gain transistor 21 and the drain of gain transistor 22. Also, a resistor 25 is connected between the gate of gain transistor 22 (and the drain of gain transistor 21) and ground.

Output driver circuit 20 is a two-stage amplifier. During operation, gain transistor 21 provides a first stage gain, and gain transistor 22 provides a second stage gain. Output driver circuit 20 receives input signals at the gate of gain transistor 21 and yields output signals at a pad 24 that is connected to the drain of gain transistor 22.

In response to an occurrence of an ESD event, both resistor 25 and Miller compensation capacitor 23 immediately turn on gain transistor 22 for the purpose of draining charges of the ESD event from pad 24 to ground. Gain transistor 22 is a significant large device that is capable of draining the charges of the ESD event from pad 24 to ground. For the present embodiment, the width of gain transistor 22 is preferably 1,500 µm. In contrast, the width of gain transistor 21 is only 64 µm.

With appropriate component values and device sizes, resistor 25 and Miller compensation capacitor 23 provide both output driving function and ESD protection for output driver circuit 20. Resistor 25 should be set at a value that will not interfere with the functionality of output driver circuit 20 during normal operations. Miller compensation capacitor 23 must have a sufficiently large value so as to limit the bandwidth of the two-stage amplifier and prevent oscillation. The value of Miller compensation capacitor 23 also depends on the transconductances of gain transistors 21–22 and the value of loading capacitance (not shown).

The RC time-constant formed by the product of the value of Miller compensation capacitance 23 and the value of resistor 25 should be devised for effective ESD protection. If the value of resistor 25 is too small, the amplifier gain will be reduced. For the present embodiment, the value of resistor 25 is preferably 20 KΩ and the value of Miller compensation capacitor 23 is preferably 5 pF.

As has been described, the present invention provides an output driver having ESD protection. Because one of the gain transistors within the output driver serves dual purposes, significant silicon area can be saved without compromising ESD protection.

While the invention has been particularly shown and described with reference to a preferred embodiment, it will be understood by those skilled in the art that various changes in form and detail may be made therein without departing from the spirit and scope of the invention.

What is claimed is:

1. An output driver having electrostatic discharge (ESD) protection, said output driver comprising:
    a first gain transistor to provide a first stage gain;
    a second gain transistor connected to said first gain transistor to provide a second stage gain;
    a capacitor connected to said first and second gain transistors to provide a compensation function between said first and second gain transistors during normal operations, wherein said capacitor turns on said second gain transistor to drain the electrostatic charges to ground, in response to an occurrence of an ESD event; and
    a resistor connected to said first and second gain transistors for returning said second gain transistor to normal operations after said occurrence of said ESD event.

2. The output driver of claim 1, wherein a drain of said first gain transistor is connected to a drain of said second gain transistor.

3. The output driver of claim 2, wherein a source of said first gain transistor is connected to ground.

4. The output driver of claim 1, wherein said capacitor is connected between said drain of said first gain transistor and said drain of said second gain transistor.

5. The output driver of claim 1, wherein said resistor is connected between a gate of said second gain transistor and ground.

6. The output driver of claim 1, wherein said drain of said second gain transistor is connected to a pad.

7. The output driver of claim 6, wherein a source of said second gain transistor is connected to ground.

* * * * *